(12) United States Patent
Cannavo et al.

(10) Patent No.: US 11,496,040 B2
(45) Date of Patent: Nov. 8, 2022

(54) METHOD FOR TRIGGERING THE CHANGING OF A TRANSISTOR TO THE ON STATE

(71) Applicant: VITESCO TECHNOLOGIES GMBH, Hanover (DE)

(72) Inventors: Jean Cannavo, Toulouse (FR); Cedrick Biellmann, Toulouse (FR); Thierry Bavois, Toulouse (FR)

(73) Assignee: VITESCO TECHNOLOGIES GMBH, Hanover (DE)

( * ) Notice: Subject to any disclaimer, the term of this patent is extended or adjusted under 35 U.S.C. 154(b) by 24 days.

(21) Appl. No.: 17/259,060

(22) PCT Filed: Jul. 9, 2019

(86) PCT No.: PCT/EP2019/068360
§ 371 (c)(1),
(2) Date: Jan. 8, 2021

(87) PCT Pub. No.: WO2020/011768
PCT Pub. Date: Jan. 16, 2020

(65) Prior Publication Data
US 2022/0140721 A1 May 5, 2022

(30) Foreign Application Priority Data
Jul. 10, 2018 (FR) ...................... 1856313

(51) Int. Cl.
*H02M 1/08* (2006.01)
*H02M 3/00* (2006.01)
*H02M 3/156* (2006.01)

(52) U.S. Cl.
CPC ............... *H02M 1/08* (2013.01); *H02M 3/01* (2021.05); *H02M 3/156* (2013.01)

(58) Field of Classification Search
None
See application file for complete search history.

(56) References Cited

U.S. PATENT DOCUMENTS

| | | |
|---|---|---|
| 2010/0315062 A1 | 12/2010 | Hung et al. |
| 2012/0049822 A1 | 3/2012 | Li et al. |
| 2017/0288553 A1 | 10/2017 | Fahlenkamp et al. |
| 2018/0279431 A1* | 9/2018 | Schaemann ............ H02M 1/08 |

OTHER PUBLICATIONS

International Search Report and Written Opinion of the ISA for PCT/EP2019/068360 dated Sep. 26, 2019, 13 pages.

* cited by examiner

*Primary Examiner* — Jeffery S Zweizig
(74) *Attorney, Agent, or Firm* — Nixon & Vanderhye

(57) ABSTRACT

Disclosed is a method for triggering the switching of a switching transistor of a quasi-resonant DC-to-DC voltage converter to the on state. The method includes the steps of phase-shifting the drain voltage of the transistor by a pre-determined temporal phase-shift value that corresponds to the difference between the duration of a quarter of the period of the damped sinusoidal oscillation generated when the transistor is switched off and the period of time that elapses between the command to switch the transistor to the on state and the transistor actually conducting, and, when the phase-shifted voltage is equal to the reference voltage, triggering the command to switch the transistor to the on state such that the transistor starts conducting at the time when the value of the drain voltage is at a minimum.

19 Claims, 2 Drawing Sheets

METHOD FOR TRIGGERING THE CHANGING OF A TRANSISTOR TO THE ON STATE

This application is the U.S. national phase of International Application No. PCT/EP2019/068360 filed Jul. 9, 2019 which designated the U.S. and claims priority to FR Patent Application No. 1856313 filed Jul. 10, 2018, the entire contents of each of which are hereby incorporated by reference.

BACKGROUND OF THE INVENTION

Field of the Invention

The present invention relates to voltage conversion and more particularly to a method for triggering the switching of a switching transistor of a quasi-resonant DC-to-DC voltage converter to the on state.

Description of the Related Art

A DC-to-DC voltage converter makes it possible to transform an input voltage, for example 12 V, into a higher output voltage, for example 65 V, or vice versa. The principle consists in charging a coil with current and in interrupting the current cyclically using a switch, in particular a transistor, for example a MOS transistor.

In a solution of this kind, the alternation of the switching of the transistor to the on state and to the off state generates losses known as "switching" losses. More precisely, these losses occur when current is still flowing through the coil and the transistor has a positive voltage between its drain and its source when the transistor is switched to the on state (known as switching "ON" by those skilled in the art). These losses increase with the intensity of the currents flowing simultaneously through the coil and through the transistor and with the voltage across the terminals of the transistor. Now, it is important to control these losses because they significantly reduce the efficiency of the converter.

One solution that makes it possible to reduce switching losses, known as a "quasi-resonant" DC-to-DC converter, consists in synchronizing the triggering of the instant at which the transistor is switched to the on state with the time interval (called the "resonance" time interval) during which the intensity of the current flowing through the coil is zero or negative (i.e. flowing in the opposite direction), and the voltage across the terminals of the transistor (i.e. between the drain and the source) is minimal (or, better still, zero or negative).

In practice, three methods are known for triggering the switching of the transistor to the on state. A first method consists in commanding the switching of the transistor to the on state as soon as the value of its drain voltage reaches zero as it decreases. A second method consists in comparing the value of the drain voltage of the transistor with a value of this same drain voltage phase-shifted by more than 180° by a low-pass RC filter, then in commanding the switching of the transistor to the on state when these two values are equal. A third method consists in using a secondary winding of the coil, i.e. using a voltage transformer which commands the switching of the transistor to the on state (ON) when the voltage of the secondary winding detects that a voltage across the terminals of the transistor drops below a predetermined threshold.

The first method cannot be used when the converter is a "step-up" converter (or "boost" converter to those skilled in the art) and its output voltage is less than twice its input voltage, or when the converter is a "step-down" converter (or "buck" converter to those skilled in the art) and its output voltage is less than half its input voltage. This is because, in these two cases, the drain voltage passes through positive minima but never becomes zero, which prevents the triggering of the switching of the transistor to the on state and presents a significant drawback, especially since these types of converters are relatively common.

The series capacitor used in the second method generates a drain voltage signal delayed by more than 180° in relation to the drain voltage signal after demagnetization of the coil (i.e. when the current flowing through the coil is zero), which is added to the time required to compare the drain voltage and the drain voltage delayed by the series capacitor and to command the switching of the transistor to the on state. The result of this very often is that the resonance time interval has already elapsed when the switching of the transistor to the on state is triggered, which can lead to switching losses and again presents a significant drawback.

Finally, the third method requires the use of a transformer, which is particularly costly, in particular in the context of the use of the converter in a motor vehicle, for which it may be important or even necessary to limit the cost of equipment.

There is therefore a need for a simple, rapid, reliable, inexpensive and efficient solution making it possible to trigger the switching of the transistor to the on state during the resonance time interval.

SUMMARY OF THE INVENTION

To this end, a subject of the invention is firstly a method for triggering the switching of a switching transistor of a quasi-resonant DC-to-DC voltage converter to the on state, said converter being supplied with an input voltage and comprising a control module and an induction coil connected to a field-effect transistor comprising a drain, a source and a gate, said gate being connected to the control module in order for said control module to control the transistor so that it assumes an on state in which current flows between the drain and the source or an off state in which current does not flow between the drain and the source, the voltage measured at the drain taking, when the transistor is switched off, the form of a square wave followed by a damped sinusoidal oscillation centered around the input voltage of the converter and characterized by its period, said method comprising the steps of:
phase-shifting the drain voltage of the transistor by a predetermined temporal phase-shift value that corresponds to the difference between the duration of a quarter of the period of the damped sinusoidal oscillation and the period of time that elapses between the command to switch the transistor to the on state and said transistor actually conducting,
when the phase-shifted voltage is equal to the input voltage of the converter, triggering the command to switch the transistor to the on state such that the transistor starts conducting at the time when the value of the drain voltage is at a minimum.

The method according to the invention makes it possible to switch the transistor to the on state at the instant at which the drain voltage is at a minimum, which allows the losses to be reduced. The use of the input voltage of the converter as the voltage that triggers the command to switch the transistor to the on state, as opposed to a zero voltage as is implemented in the solutions of the prior art, allows the converter to be operational across the entire range of the input voltage and also when the output voltage is more than twice its input voltage. Furthermore, the invention makes it possible to avoid the use of a transformer, the use of a simple coil making it possible to simplify the architecture of the converter and to reduce the cost thereof.

Preferably, the predetermined temporal phase-shift value is obtained by using an RC phase-shifting filter, the product of the resistance value and the capacitance value of which is equal to:

$$RC = \frac{T_{RES}}{2\pi} \times \tan\left(\frac{\pi}{2} - \frac{2\pi t_M}{T_{RES}}\right)$$

where $T_{RES}$ is the period of the damped sinusoidal oscillation and $t_M$ is the period of time that elapses between the command to switch the transistor to the on state and said transistor actually conducting.

Advantageously, the product of the resistance value and the capacitance value of the phase-shifting filter is for example between 0 and 300 ns.

According to one aspect of the invention, the transistor is a MOS transistor.

The invention also relates to a quasi-resonant DC-to-DC voltage converter for a motor vehicle, said converter being supplied with an input voltage and comprising a control module and an induction coil connected to a field-effect transistor comprising a drain, a source and a gate, said gate being connected to the control module in order for said control module to control the transistor so that it assumes an on state in which current flows between the drain and the source or an off state in which current does not flow between the drain and the source, the voltage measured at the drain taking, when the transistor is switched off, the form of a square wave followed by a damped sinusoidal oscillation centered around the input voltage of the converter and characterized by its period, the control module being configured to phase-shift the drain voltage by a predetermined value that corresponds to the difference between the duration of a quarter of the period of the damped sinusoidal oscillation and the period of time that elapses between the command by the control module to switch the transistor to the on state and said transistor actually conducting, the control module being configured to phase-shift the drain voltage of the transistor by a predetermined temporal phase-shift value that corresponds to the difference between the duration of a quarter of the period of the damped sinusoidal oscillation and the period of time that elapses between the command to switch the transistor to the on state and said transistor actually conducting, detect that the phase-shifted voltage is equal to the input voltage of the converter, and when the phase-shifted voltage is equal to the input voltage of the converter, trigger the command to switch the transistor to the on state such that the transistor starts conducting at the time when the value of the drain voltage is at a minimum.

According to one aspect of the invention, the control module comprises an RC phase-shifting filter, the product of the resistance value and the capacitance value of which is equal to:

$$RC = \frac{T_{RES}}{2\pi} \times \tan\left(\frac{\pi}{2} - \frac{2\pi t_M}{T_{RES}}\right)$$

where $T_{RES}$ is the period of the damped sinusoidal oscillation and $t_M$ is the period of time that elapses between the command to switch the transistor to the on state and said transistor actually conducting.

Preferably, the control module comprises a comparator, a first branch that includes the phase-shifting filter, which is connected both to the drain voltage and to a ground, and a second branch that includes a resistive bridge, which is connected both to the input voltage of the converter and to ground, and the midpoint of which is connected to a first input of the comparator in order to serve as a reference voltage.

According to one aspect of the invention, the first branch includes a capacitor and a resistive bridge, said resistive bridge consisting of a first resistor, which is connected both to the drain voltage and to a midpoint of said resistive bridge, and a second resistor, which is connected both to the midpoint of said resistive bridge and to ground, the capacitor being connected both to the midpoint of said resistive bridge and to ground, and the midpoint also being connected to a second input of the comparator.

Advantageously, the product of the resistance value and the capacitance value of the phase-shifting filter is for example between 0 and 300 ns.

According to one aspect of the invention, the transistor is a MOS transistor.

Finally, the invention relates to a motor vehicle comprising a converter as presented above.

BRIEF DESCRIPTION OF THE DRAWINGS

Other features and advantages of the invention will become apparent from the following description, given with reference to the appended figures that are given by way of non-limiting example and in which identical references are given to similar objects.

DESCRIPTION OF THE PREFERRED EMBODIMENTS

Figure 1:
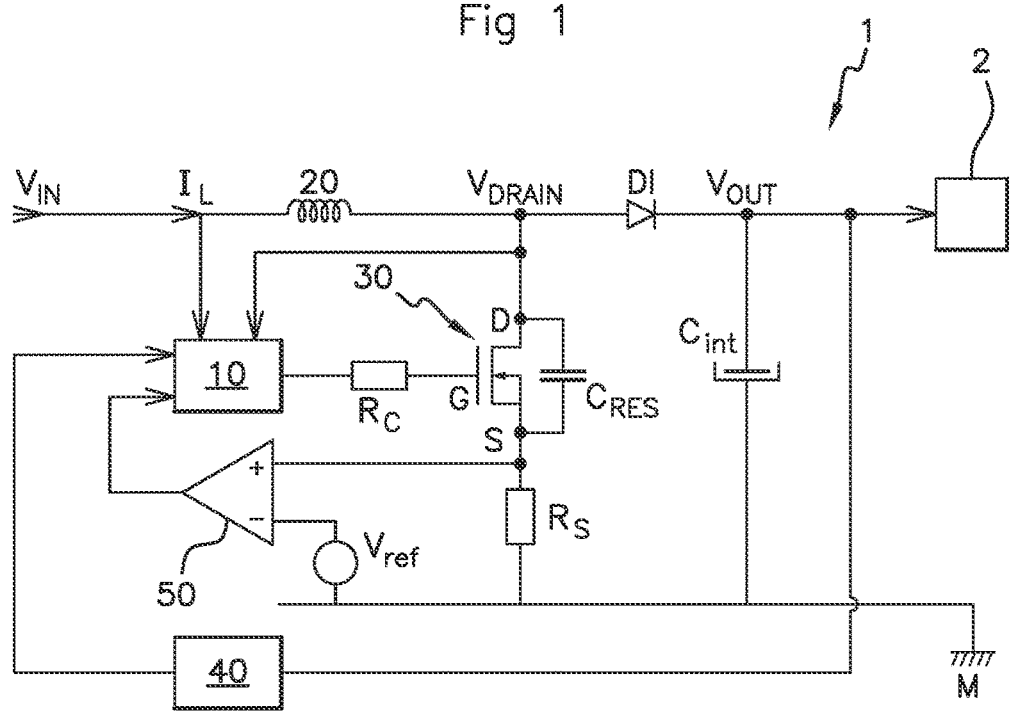
FIG. 1 illustrates one embodiment of the converter according to the invention.

An example of a converter 1 according to the invention has been shown in FIG. 1. The converter 1 is intended to be installed in a motor vehicle, for example in order to supply an output voltage Vout for controlling fuel injectors 2.

The converter 1 is a quasi-resonant DC-to-DC voltage converter. In the example described below, but nonlimiting, the converter 1 is a step-up (boost) converter for charging a capacitor known as an "intermediate" capacitor Cint, which supplies the power needed to activate the fuel injectors 2.

The converter 1 transforms an input voltage $V_{IN}$ (input current $I_L$) supplied by the battery of the vehicle into an output voltage Vout applied to the terminals of the intermediate capacitor Cint, the voltages being measured in relation to a ground M. The converter is configured to make the output voltage Vout tend toward a target value.

Still with reference to FIG. 1, the converter 1 comprises a control module 10, an induction coil 20, a field-effect transistor 30, a feedback controller 40 and a comparator 50.

The induction coil 20 is connected at the input of the circuit so as to be charged when the input current $I_L$ flows through it.

A diode DI is connected between the induction coil 20 and the high terminal of the intermediate capacitor Cint, which corresponds to the output of the converter 1 that is connected to the injectors 2. The diode DI allows current to flow from the induction coil 20 to the intermediate capacitor Cint, but prevents current from flowing from the intermediate capacitor Cint to the induction coil 20 in order to prevent the intermediate capacitor Cint from discharging into the converter 1.

The transistor 30 comprises a drain D, a source S and a gate G, said gate G being connected to the control module 10 in order for said control module 10 to control the transistor 30 so that it assumes an on state in which current flows between the drain D and the source S or an off state in which current does not flow between the drain D and the source S. When the control module 10 controls the transistor 30, via the gate G, so that said transistor 30 switches from the off state to the on state, a time delay elapses between the triggering of the control of the gate G of the transistor 30 and the instant at which the current flows between the drain D and the source of the transistor 30 (i.e. the instant at which the transistor 30 starts to conduct).

The source S is connected to ground M via a shunt resistor Rs. The gate G is connected to the control module via a control resistor Rc. A capacitor Cres is connected in parallel with the transistor 30, between the drain D and the source S, in order to make the converter 1 quasi-resonant.

Figure 3:
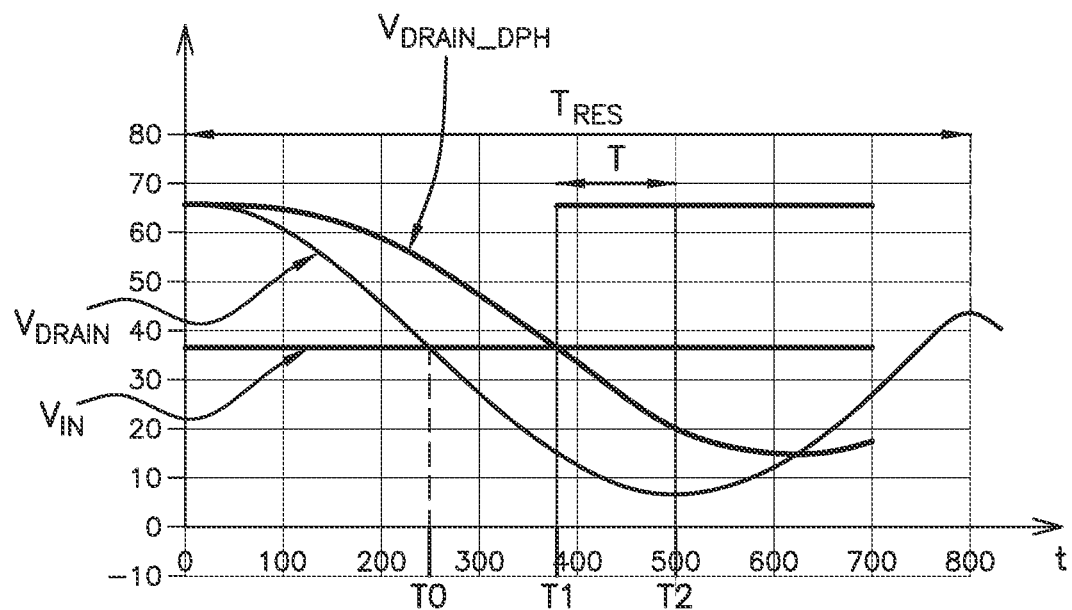
FIG. 3 is an example of a voltage diagram illustrating the drain voltage, the phase-shifted drain voltage, the triggering of the switching of the transistor to the on state and the actual switching of the transistor to the on state.

With reference to FIG. 3, the voltage $V_{DRAIN}$ measured at the drain D takes, when the transistor 30 is switched off, the form of a square wave followed by a damped sinusoidal oscillation centered around the input voltage $V_{IN}$ of the converter 1 and characterized by its period $T_{RES}$.

The control module 10 is configured to phase-shift the drain voltage $V_{DRAIN}$ by a predetermined value that corresponds to the difference between the duration of a quarter of the period $T_{RES}$ of the damped sinusoidal oscillation and the period of time that elapses between the command by the control module 10 to switch the transistor 30 to the on state and said transistor 30 actually conducting.

The control module 10 is configured to detect that the phase-shifted voltage is equal to the input voltage $V_{IN}$ and, when the phase-shifted voltage is equal to the input voltage $V_{IN}$, to control the switching of the transistor 30 to the on state so that the transistor 30 starts conducting at the time when the value of the drain voltage $V_{DRAIN}$ is at a minimum.

Figure 2:
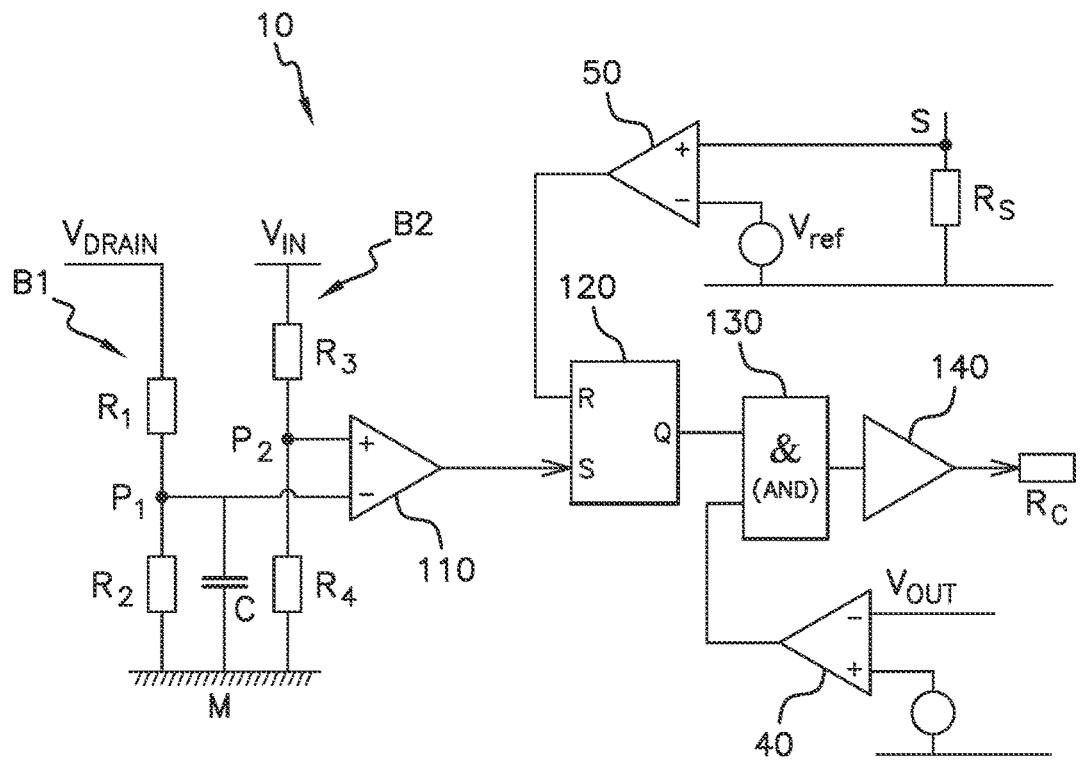
FIG. 2 illustrates one embodiment of the control module of the converter according to the invention.

The feedback controller 40 makes it possible to measure the output voltage Vout of the converter 1 in order to activate or deactivate the converter 1. More precisely, the feedback controller 40 activates the converter 1 when the output voltage Vout is less than its target value and deactivates the converter 1 when the output voltage Vout is greater than or equal to its target value. In the example of FIG. 2, the feedback controller 40 is a voltage comparator that compares the output voltage Vout of the converter 1 with its target voltage, for example 65 V.

The comparator 50 receives as input a fixed reference voltage Vref and the voltage which is defined across the terminals of the shunt resistor Rs and gives an image of the current flowing through the source S of the transistor 30. The output of the comparator 50 is connected to the control module 10 and makes it possible to switch off the gate G of the transistor 30 when the current flowing through the source S reaches the fixed current value equal to the ratio of the value of the fixed reference voltage Vref to the resistance value of the shunt resistor Rs. The value of the fixed reference voltage Vref may for example be between 100 mV and 300 mV.

An example of a control module 10 has been shown in FIG. 2. The control module 10 firstly comprises two branches B1, B2.

The first branch B1 includes a resistive bridge consisting of a first resistor R1, which is connected both to the drain voltage $V_{DRAIN}$ and to a midpoint P1 of the bridge, and a second resistor R2, which is connected both to the midpoint P1 of the bridge and to ground M. A capacitor C is connected both to the midpoint P1 of the bridge and to ground M. The equivalent resistance of the resistive bridge is denoted R and the assembly consisting of the resistive bridge R and the capacitor C constitutes an RC phase-shifting filter. The midpoint P1 is also connected to one of the inputs of a comparator 110.

The second branch B2 also includes a resistive bridge consisting of a first resistor R3, which is connected both to the input voltage $V_{IN}$ of the converter 1 and to a midpoint P2 of the bridge, and a second resistor R4, which is connected both to the midpoint P2 of the bridge and to ground M. The midpoint P2 is connected to the other input of the comparator in order to serve as a reference voltage for said comparator 110.

The values of the resistance R and capacitance C of the phase-shifting filter are chosen such that the product of the resistance value R and the capacitance value C is equal to:

$$RC = \frac{T_{RES}}{2\pi} \times \tan\left(\frac{\pi}{2} - \frac{2\pi t_M}{T_{RES}}\right) \text{ with } R = \frac{(R1 \times R2)}{(R1 + R2)}$$

where $T_{RES}$ is the period of the damped sinusoidal oscillation and $t_M$ is the period of time that elapses between the command to switch the transistor 30 to the on state and said transistor 30 actually conducting.

The control module 10 comprises an RS-Q flip-flop 120, which is connected to the output of the comparator 110 via its S (Set) input and to the output of the comparator 50 via its R (Reset) input. The output Q of the flip-flop 120 is connected to a first input of an AND logic gate 130. This AND logic gate 130 is connected via its second input to the feedback controller 40, which is a voltage comparator feedback controller, with inverse logic. The output of the AND logic gate 130 is connected to a driver 140 for controlling the gate G of the transistor 30.

Figure 4:
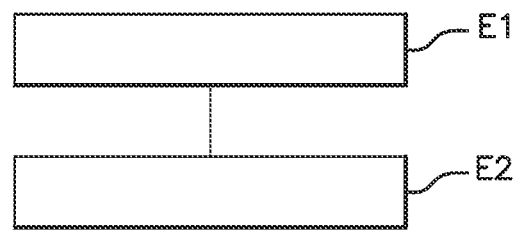
FIG. 4 schematically illustrates one embodiment of the method according to the invention.

The implementation of the method according to the invention will now be described with reference to FIGS. 3 and 4.

When the current flowing through the coil 20 becomes zero, the drain voltage $V_{DRAIN}$ of the transistor 30 becomes equal to the input voltage $V_N$ of the converter 1 at an instant T0.

Then, the comparator 110 detects that the drain voltage $V_{DRAIN\_DPH}$ phase-shifted by the branches B1, B2 of the control module 10 becomes equal to the input voltage Vm at an instant T1 after the instant T0 while being temporally offset by the phase-shift value generated by the RC phase-shifting filter in a step E1.

The output signal supplied by the comparator 110 is used to command, in a step E2, the switching of the transistor 30 to the on state via the driver 140 by controlling the input of the flip-flop 120.

The time delay T which then elapses between the triggering of the switching of the transistor 30 to the on state at the instant T1 and the transistor 30 actually conducting at an instant T2, which is defined by the phase shift generated by the RC phase-shifting filter, then allows the transistor 30 to start conducting at said instant T2 at which the value of the drain voltage $V_{DRAIN}$ is at a minimum.

The method according to the invention thus makes it possible to minimize the switching losses of the transistor 30 by causing it to start conducting at the time when such losses are lowest.

The invention claimed is:

1. A method for triggering switching of a switching transistor of a quasi-resonant DC-to-DC voltage converter to an on state, said converter being supplied with an input voltage and including a control module and an induction coil connected to the switching transistor including a drain, a source, and a gate, said gate being connected to the control module in order for said control module to control the transistor so that the transistor assumes the on state in which current flows between the drain and the source or an off state in which current does not flow between the drain and the source, the voltage measured at the drain taking, when the transistor is switched off, the form of a square wave followed by a damped sinusoidal oscillation centered around the input voltage of the converter and characterized by its period, said method comprising the steps of:
   phase-shifting the drain voltage of the transistor by a predetermined temporal phase-shift value that corresponds to the difference between the duration of a quarter of the period of the damped sinusoidal oscillation and the period of time that elapses between the command to switch the transistor to the on state and said transistor actually conducting; and
   when the phase-shifted voltage is equal to the input voltage of the converter, triggering the command to switch the transistor to the on state such that the transistor starts conducting at the time when the value of the drain voltage is at a minimum.

2. The method as claimed in claim 1, wherein the predetermined temporal phase-shift value is obtained by using an RC phase-shifting filter, the product of the resistance value (R) and the capacitance value (C) of which is equal to:

$$RC = \frac{T_{RES}}{2\pi} \times \tan\left(\frac{\pi}{2} - \frac{2\pi t_M}{T_{RES}}\right)$$

where $T_{RES}$ is the period of the damped sinusoidal oscillation and $t_M$ is the period of time that elapses between the command to switch the transistor to the on state and said transistor actually conducting.

3. The method as claimed in claim 2, wherein the product of the resistance value and the capacitance value of the phase-shifting filter is for example between 0 and 300 ns.

4. The method as claimed in claim 1, wherein the transistor is a MOS transistor.

5. The method as claimed in claim 2, wherein the transistor is a MOS transistor.

6. The method as claimed in claim 3, wherein the transistor is a MOS transistor.

7. A quasi-resonant DC-to-DC voltage converter for a motor vehicle, said converter being supplied with an input voltage and including a control module and an induction coil connected to a field-effect transistor including a drain, a source, and a gate, said gate being connected to the control module in order for said control module to control the transistor so that the transistor assumes an on state in which current flows between the drain and the source or an off state in which current does not flow between the drain and the source, the voltage measured at the drain taking, when the transistor is switched off, the form of a square wave followed by a damped sinusoidal oscillation centered around the input voltage of the converter and characterized by its period, the control module being configured to phase-shift the drain voltage by a predetermined value that corresponds to the difference between the duration of a quarter of the period of the damped sinusoidal oscillation and the period of time that elapses between the command by the control module to switch the transistor to the on state and said transistor actually conducting, the control module being configured to:
   phase-shift the drain voltage of the transistor by a predetermined temporal phase-shift value that corresponds to the difference between the duration of a quarter of the period of the damped sinusoidal oscillation and the period of time that elapses between the command to switch the transistor to the on state and said transistor actually conducting;
   detect that the phase-shifted voltage is equal to the input voltage of the converter; and
   when the phase-shifted voltage is equal to the input voltage of the converter, trigger the command to switch the transistor to the on state such that the transistor starts conducting at the time when the value of the drain voltage is at a minimum.

8. The converter as claimed in claim 7, wherein the control module comprises an RC phase-shifting filter, the product of the resistance value (R) and the capacitance value (C) of which is equal to:

$$RC = \frac{T_{RES}}{2\pi} \times \tan\left(\frac{\pi}{2} - \frac{2\pi t_M}{T_{RES}}\right)$$

where $T_{RES}$ is the period of the damped sinusoidal oscillation and $t_M$ is the period of time that elapses between the command to switch the transistor to the on state and said transistor actually conducting.

9. The converter as claimed in claim 8, wherein the control module comprises a comparator, a first branch that includes the phase-shifting filter, which is connected both to the drain voltage and to a ground, and a second branch that includes a resistive bridge, which is connected both to the input voltage of the converter and to ground, and the midpoint of which is connected to a first input of the comparator in order to serve as a reference voltage.

10. The converter as claimed in the preceding claim 9, wherein the first branch includes a capacitor and a resistive bridge, said resistive bridge consisting of
   a first resistor, which is connected both to the drain voltage and to a midpoint of said resistive bridge, and
   a second resistor, which is connected both to the midpoint of said resistive bridge and to ground, the capacitor being connected both to the midpoint of said resistive bridge and to ground, and the midpoint being connected to a second input of the comparator.

11. The converter as claimed in claim 7, wherein the transistor is a MOS transistor.

12. A motor vehicle comprising:
   the converter as claimed in claim 7.

13. The converter as claimed in claim 8, wherein the transistor is a MOS transistor.

14. The converter as claimed in claim 9, wherein the transistor is a MOS transistor.

15. The converter as claimed in claim 10, wherein the transistor is a MOS transistor.

16. A motor vehicle comprising:
the converter as claimed in claim 8.

17. A motor vehicle comprising:
the converter as claimed in claim 9.

18. A motor vehicle comprising:
the converter as claimed in claim 10.

19. A motor vehicle comprising:
the converter as claimed in claim 11.

\* \* \* \* \*